(12) United States Patent
Vossenberg et al.

(10) Patent No.: US 6,790,699 B2
(45) Date of Patent: Sep. 14, 2004

(54) METHOD FOR MANUFACTURING A SEMICONDUCTOR DEVICE

(75) Inventors: Heinz-Georg Vossenberg, Pfullingen (DE); Wilhelm Frey, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/193,351

(22) Filed: Jul. 10, 2002

(65) Prior Publication Data

US 2004/0009623 A1 Jan. 15, 2004

(51) Int. Cl.[7] .............................................. H01L 21/00
(52) U.S. Cl. ............................................ 438/50; 438/48
(58) Field of Search ..................................... 438/48, 50

(56) References Cited

U.S. PATENT DOCUMENTS

| | | | |
|---|---|---|---|
| 6,308,575 B1 | 10/2001 | Yang et al. | |
| 6,613,972 B2 * | 9/2003 | Cohen et al. | 136/209 |
| 2003/0005774 A1 * | 1/2003 | Suzuki et al. | 73/24 |
| 2003/0034535 A1 * | 2/2003 | Barenburg et al. | 257/415 |
| 2003/0058065 A1 * | 3/2003 | Abe et al. | 333/188 |

FOREIGN PATENT DOCUMENTS

| | | |
|---|---|---|
| DE | 195 23 895 | 1/1997 |
| DE | 196 26 081 | 1/1998 |
| DE | 197 41 428 | 1/1999 |
| DE | 100 54 144 | 5/2001 |
| DE | 100 00 552 | 8/2001 |
| EP | 0 727 650 | 8/1996 |
| EP | 882 965 | 12/1998 |
| EP | 1 014 095 | 6/2000 |
| EP | 1 152 232 | 11/2001 |
| JP | 11-97413 | 9/1999 |
| WO | WO 96/37784 | 11/1996 |
| WO | WO 97/45699 | 12/1997 |
| WO | WO 99/34187 | 7/1999 |
| WO | WO 00/09440 | 2/2000 |
| WO | WO 00/11376 | 3/2000 |
| WO | WO 00/11441 | 3/2000 |
| WO | WO 00/12427 | 3/2000 |
| WO | WO 00/12428 | 3/2000 |
| WO | WO 00/29824 | 5/2000 |
| WO | WO 00/33044 | 6/2000 |
| WO | WO 00/33045 | 6/2000 |
| WO | WO 00/33047 | 6/2000 |
| WO | WO 01/46665 | 6/2001 |

* cited by examiner

*Primary Examiner*—Alexander Ghyka
(74) *Attorney, Agent, or Firm*—Kenyon & Kenyon

(57) ABSTRACT

A method for manufacturing a semiconductor device includes the steps of providing a substrate, depositing a monocrystalline sacrificial layer onto the substrate, depositing a monocrystalline function layer onto the sacrificial layer, and removing at least part of the sacrificial layer after the function layer depositing step.

26 Claims, 8 Drawing Sheets

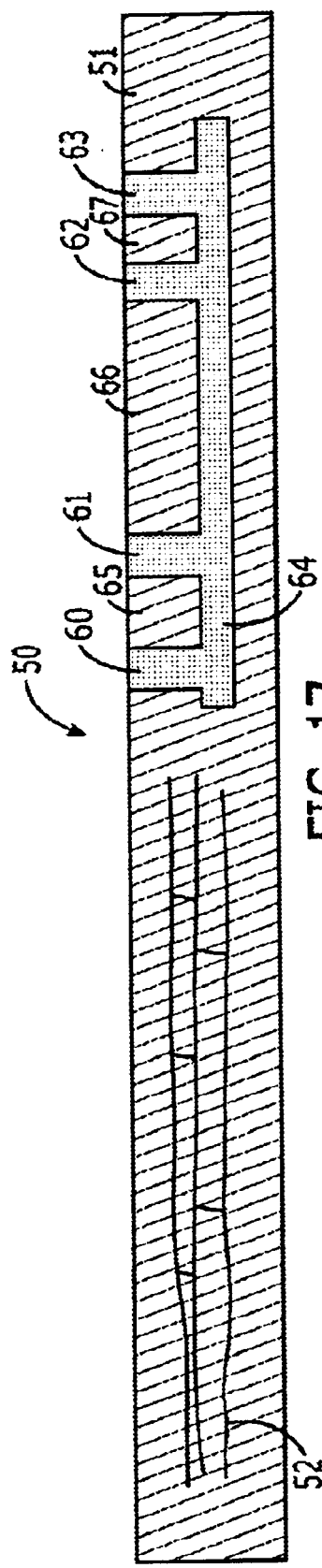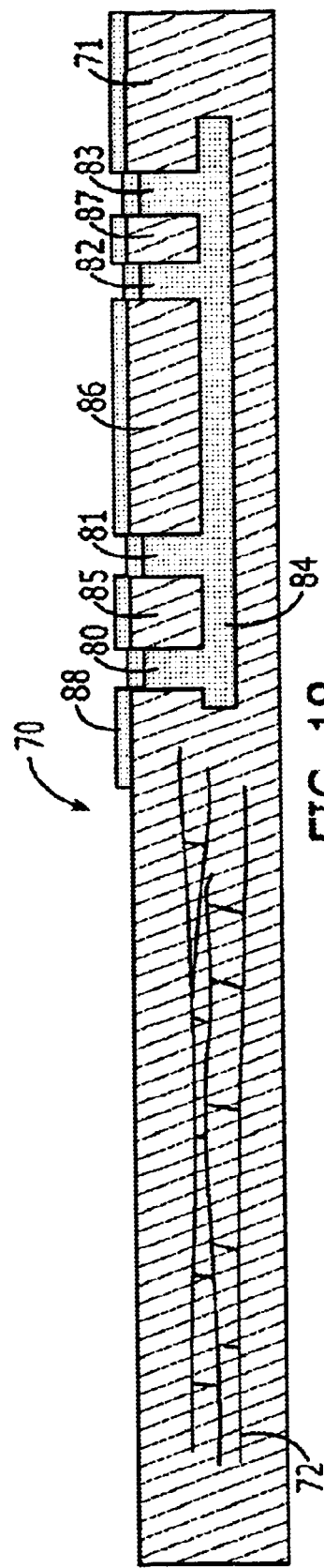

METHOD FOR MANUFACTURING A SEMICONDUCTOR DEVICE

FIELD OF THE INVENTION

The present invention relates to a semiconductor device and to a method for manufacturing a semiconductor device, and relates in particular to a method for etching used in manufacturing a semiconductor device.

BACKGROUND INFORMATION

There are two basic principles for manufacturing semiconductor devices, such as micro-electromechanical systems (MEMS). The first available principle for manufacturing semiconductor devices is known as bulkmicromechanic (BMM). According to the bulkmicromechanic principle, a wafer substrate is provided, which may be a monocrystalline silicon substrate, and the necessary structures are etched into this wafer substrate. Thus, for example, when manufacturing an oscillator for an acceleration sensor, the self-supporting structure of the oscillator is formed into the wafer substrate.

The second basic principle for manufacturing semiconductor devices, such as micro-electromechanical systems, is known as surface-micromachining (SMM). In this case, the microstructures are manufactured by using structural and sacrificial films or layers, i.e., thin-film microstructures are fabricated by the selective removal of a sacrificial film. A polycrystalline silicon (poly-Si) may be deposited by low-pressure chemical vapor deposition (LPCVD) on a substrate, and silicon dioxide ($SiO_2$) may typically be used for the sacrificial layer. Hydrofluoric acid (HF) may be used as a selective release etchant in poly-Si micromachining. In surface-micromachining, the substrate or wafer is essentially used as a carrier for the microstructures erected on the surface of the substrate.

In many cases a co-fabrication of surface-microstructures and microelectronic circuits is desirable from the perspectives of system performance and manufacturing costs. In this respect, it is highly desirable if the micro-electromechanical systems can be manufactured after the completion of integrated circuits comprising electronic circuits on or in the substrate. These electronic circuits may include a metallization such as, e.g., an aluminum (Al) metallization. Due to the use of hydrofluoric acid (HF) for etching the poly-Si sacrificial layer, integrated circuits that include electronic circuits may have to be covered in order to protect them from the HF etchant which would damage the integrated circuits already present on the substrate.

SUMMARY

According to an example embodiment of the present invention, a method for manufacturing a semiconductor device includes the following steps: providing a substrate; depositing a first monocrystalline layer which is a sacrificial layer on the substrate; depositing a second monocrystalline layer which is a function layer on the first monocrystalline layer; and etching at least part of the first monocrystalline layer. The use of the first and second monocrystalline layers in accordance with this method may allow for performing a back-end etching of the sacrificial layer with an etchant, such as, e.g., $H_2O_2$, which may not be harmful to a metallization of an integrated circuit on the substrate, and therefore may allow for the integration of integrated circuits such as aluminum circuits, sensors, control circuitry, other elements, etc., on and/or in the substrate.

In another example embodiment of the present invention, $Si_xGe_y$ may used for the first monocrystalline layer, which may allow for the integration of the foregoing method in existing processes for manufacturing semiconductor devices since $Si_xGe_y$ does not have a contaminating effect. Thus, the first monocrystalline layer may be applied at a very early stage in the manufacturing process of the semiconductor device and may not have a negative influence on the temperature-budget of an existing process for manufacturing the semiconductor device. Also, the use of the monocrystalline sacrificial layer in surface-micromachining may allow for a monocrystalline function layer. The function layer may include a layer of the semiconductor device in which, by which and/or on which the function of the semiconductor device is effected.

These and other advantages and features of the present invention will become readily apparent to those of ordinary skill in the art after reading the following detailed description of exemplary embodiments of the present invention and studying the accompanying drawings.

BRIEF DESCRIPTION OF THE DRAWINGS

FIG. 17 is a schematic cross-sectional view of an integrated circuit manufactured in accordance with the method of the present invention.

FIG. 18 is a schematic cross-sectional view of an integrated circuit manufactured in accordance with the method of the present invention.

DETAILED DESCRIPTION

FIGS. 1 to 16 schematically illustrate the sequence(s) of steps for manufacturing a semiconductor device according to the present invention. More particularly, FIGS. 1 to 16 schematically illustrate the method(s) of manufacturing a sensor having a micro-mechanical system manufactured by surface-micromachining.

Figure 1:
FIG. 1 is a schematic cross-sectional view of a semiconductor device in a first intermediate stage during manufacturing.
Figure 2:
FIG. 2 is a schematic cross-sectional view of the semiconductor device in a subsequent intermediate stage during manufacturing.
Figure 3:
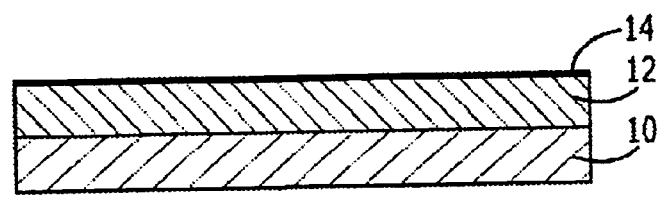
FIG. 3 is a schematic cross-sectional view of the semiconductor device in a subsequent intermediate stage during manufacturing.
Figure 4:
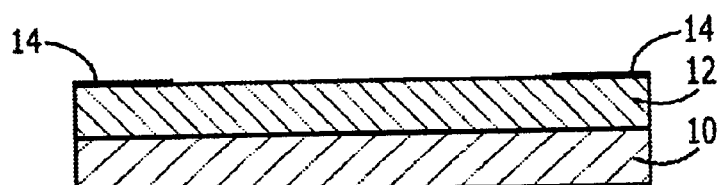
FIG. 4 is a schematic cross-sectional view of the semiconductor device in a subsequent intermediate stage during manufacturing.
Figure 5:
FIG. 5 is a schematic cross-sectional view of the semiconductor device in a subsequent intermediate stage during manufacturing.
Figure 6:
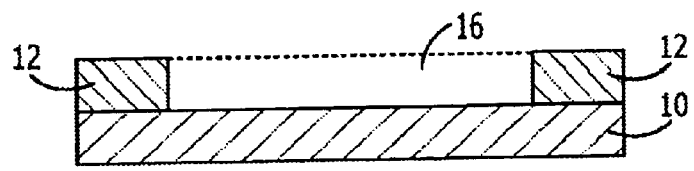
FIG. 6 is a schematic cross-sectional view of the semiconductor device in a subsequent intermediate stage during manufacturing.

FIG. 1 is a schematic cross-sectional view of a substrate 10, which may be made of silicon material, e.g., monocrystalline silicon. FIG. 2 is a schematic cross-sectional view of the substrate 10 on which a masking layer 12 has been applied or deposited. The masking layer 12 may be formed of an oxide material, e.g., silicon dioxide. FIG. 3 is a schematic cross-sectional view of the substrate 10 and masking layer 12 on which a photoresist 14 has been applied, e.g., by spin coating, to the masking layer 12. After application of the photoresist 14 onto the masking layer 12, the photoresist 14 is dried. After the photoresist 14 has dried, the photoresist 14 is exposed in a predetermined pattern in accordance with a mask corresponding to the predetermined pattern. The exposure may be performed in accordance with, e.g., contact, proximity or projection techniques, etc., and may be performed using, e.g., a stepper. Then, the exposed portions of the photoresist 14 are removed by developing. FIG. 4 is a schematic cross-sectional view of the substrate 10, masking layer 12 and photoresist 14 after the exposed portions of the photoresist 14 have been removed by developing. As illustrated in FIG. 4, portions of the masking layer 12 are exposed through the remaining photoresist 14 in accordance with the predetermined pattern of the mask. These exposed portions of the masking layer 12 are removed by, e.g., etching in, e.g., hydrofluoric (HF) acid. FIG. 5 is a schematic cross-sectional view of the substrate 10, masking layer 12 and photoresist 14 after the exposed portions of the masking layer 12 have been removed, the exposed portions of the masking layer 12 illustrated in phantom and indicated by reference numeral 16. Then, the remaining photoresist 14 is removed or stripped, for example, with a solvent or a plasma stripper, from the masking layer 12. FIG. 6 is a schematic cross-sectional view of the substrate 10 and the masking layer 12 after the remaining photoresist 14 has been removed from the masking layer 12. Thus, FIG. 6 schematically illustrates the substrate 10 with a structured masking layer 12.

Figure 7:
FIG. 7 is a schematic cross-sectional view of the semiconductor device in a subsequent intermediate stage during manufacturing.
Figure 8:
FIG. 8 is a schematic cross-sectional view of the semiconductor device in a subsequent intermediate stage during manufacturing.

A sacrificial layer 18 is then deposited onto the substrate 10 corresponding to the exposed portions 16 of the masking layer 12 that were removed if the deposition is selective (as to the substrate but not as to the mask). Alternatively, a non-selective deposition may be performed covering the whole wafer, and by CPM (chemical-mechanical polishing), grinding or plasma planarization, a structured layer stack illustrated in FIG. 7 may be obtained. Accordingly, the sacrificial layer 18 corresponds to the predetermined pattern of the mask to which the photoresist 14 was exposed. FIG. 7 is a schematic cross-sectional view of the substrate 10, the masking layer 12 and the sacrificial layer 18. The sacrificial layer 18 may be a monocrystalline layer and may include, for example, $Si_xGe_y$, $Si_xGe_{1-x}$ with $0 \leq x \leq 1$, etc. In this regard, the sacrificial layer 18 may include more Ge than Si, and the amount of Si may be less than, e.g., 35% by weight of the sacrificial layer 18. Then, the remaining portions of the masking layer 12 are removed, e.g., by etching in, for example, HF acid. FIG. 8 schematically illustrates the substrate 10 and the sacrificial layer 18 after the remaining portions of the masking layer 12 have been removed.

Figure 9:
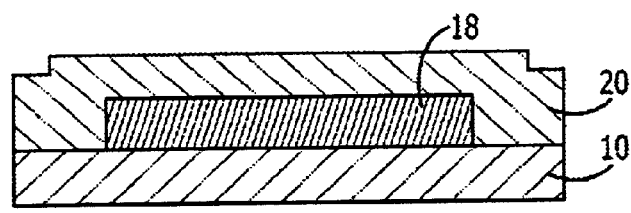
FIG. 9 is a schematic cross-sectional view of the semiconductor device in a subsequent intermediate stage during manufacturing.
Figure 10:
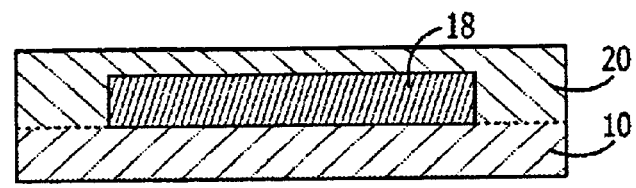
FIG. 10 is a schematic cross-sectional view of the semiconductor device in a subsequent intermediate stage during manufacturing.

Then, a layer 20, e.g., a monocrystalline Si layer, is grown or deposited onto the substrate 10 and the sacrificial layer 18, e.g., using an epitaxial reactor. FIG. 9 is a schematic cross-sectional view of the substrate 10, sacrificial layer 18 and layer 20. As illustrated in FIG. 9, the height or thickness of the layer structure may be greater in portions corresponding to the sacrificial layer 18. Accordingly, an optional planarizing procedure, e.g., by grinding, plasma etching, etc., may be performed. FIG. 10 is a schematic cross-sectional view of the substrate 10, the sacrificial layer 18 and the layer 20 after the layer 20 has been planarized. The planarization procedure may be eliminated if the layer 20 is sufficiently planar as grown or deposited onto the substrate 10 and the sacrificial layer 18.

Figure 11:
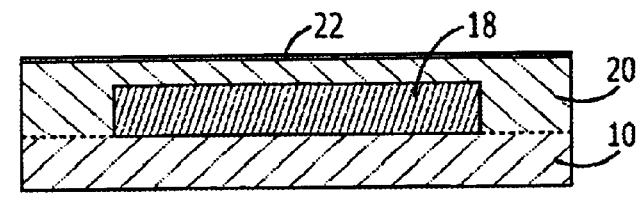
FIG. 11 is a schematic cross-sectional view of the semiconductor device in a subsequent intermediate stage during manufacturing.
Figure 12:
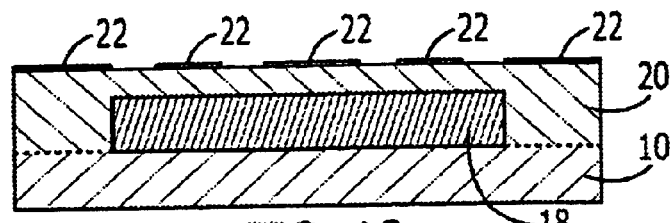
FIG. 12 is a schematic cross-sectional view of the semiconductor device in a subsequent intermediate stage during manufacturing.
Figure 13:
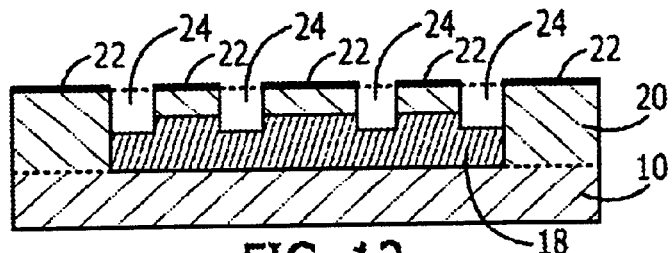
FIG. 13 is a schematic cross-sectional view of the semiconductor device in a subsequent intermediate stage during manufacturing.

Then, a photoresist 22 is applied, e.g., by spin coating, to the layer 20 and allowed to dry. FIG. 11 is a schematic cross-sectional view of the substrate 10, the sacrificial layer 18, the layer 20 and the photoresist 22. The photoresist 22 is then exposed in a predetermined pattern in accordance with a mask corresponding to the predetermined pattern. The exposure may be performed in accordance with, e.g., contact, proximity or projection techniques, etc., and may be performed using, e.g., a stepper. Then, the exposed portions of the photoresist 22 are removed by developing. FIG. 12 is a schematic cross-sectional view of the substrate 10, the sacrificial layer 18, the layer 20 and the photoresist 22 after the exposed portions of the photoresist 22 have been removed by developing. As illustrated in FIG. 12, portions of the layer 20 are exposed through the remaining photoresist 22 in accordance with the predetermined pattern of the mask. These exposed portions of the layer 20 are removed, for example, by trench and/or plasma etching techniques, to form trenches 24 that extend from the top surface of the layer 20 to the sacrificial layer 18. FIG. 13 is a schematic cross-sectional view of the substrate 10, the sacrificial layer 18, the layer 20, the photoresist 22 and the trenches 24. It should be appreciated that the trenches 24 correspond to the predetermined pattern of the mask. It should also be appreciated that the trench etching may be performed so that the trenches 24 are formed to a depth corresponding at least to the height of the layer 20 and may be performed so that the trenches 24 are formed to a depth slightly greater than the height of the layer 20, i.e., the trenches 24 are trench etched partially into the sacrificial layer 18. This arrangement provides a margin of error for the trench etching procedure. Because the sacrificial layer 18 will ultimately be removed, as described below, the depth of the trench etching is not critical. Furthermore, because the trench etching is performed to a depth into the sacrificial layer 18, which will be ultimately removed, an etch-rate-selective stop layer is not necessary in the method according to the present invention.

Figure 14:
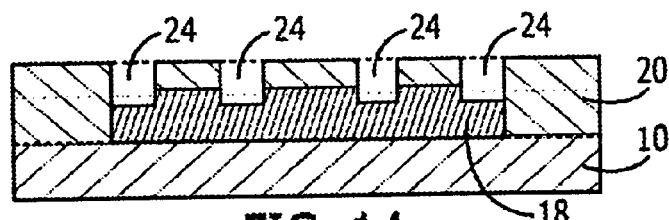
FIG. 14 is a schematic cross-sectional view of the semiconductor device in a subsequent intermediate stage during manufacturing.
Figure 15:
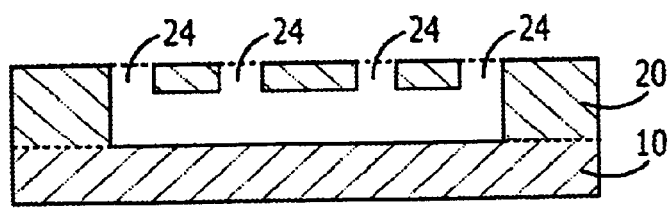
FIG. 15 is a schematic cross-sectional view of the semiconductor device in a subsequent intermediate stage during manufacturing and corresponding to an accelerometer.

Then, the remaining photoresist 22 is removed or stripped, for example, with a solvent, from the layer 20. FIG. 14 is a schematic cross-sectional view of the substrate 10, the sacrificial layer 18, the layer 20 and the trenches 24 after the remaining photoresist 22 has been removed from the layer 20. Then, the sacrificial layer 18 is removed, e.g., by introducing an etchant, e.g., $H_2O_2$, a mixture of $NH_4OH$, $H_2O_2$ and water, etc., through the trenches 24 to the sacrificial layer 18. It should be appreciated that the etchant for removing the sacrificial layer 18 may be less aggressive than the etchant used to remove the masking layer 12, e.g., HF acid. Thus, the use of a protective cover on the layer structure may not be necessary during the etching of the sacrificial layer 18. FIG. 15 is a schematic cross-sectional view of the substrate 10, layer 20 and trenches 24 after the sacrificial layer 18 has been removed. Although substrate 10 and layer 20 are described and illustrated as separate layers, it should be appreciated that if substrate 10 and layer 20 are formed of the same material, there may be no boundary formed between the substrate 10 and layer 20. That is, the substrate 10 and layer 20 may form an integral structure. Thus, the figures illustrate a boundary between the substrate 10 and the layer 20 in phantom. The structure illustrated in FIG. 15 may include a self-supporting pattern between the trenches 24. The structure illustrated in FIG. 15 may correspond to an accelerometer, which may provide for very precise measurement of acceleration due to the precise geometry of the trenches 24, the hollow space formed by the removal of the sacrificial layer 18 and the self-supporting pattern between the trenches 24.

Figure 16:
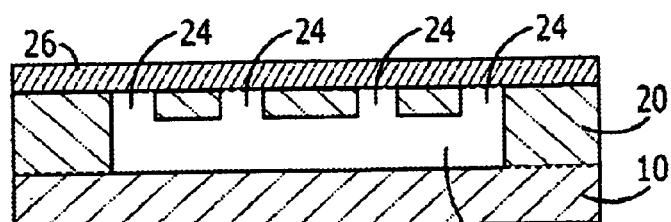
FIG. 16 is a schematic cross-sectional view of the semiconductor device in a subsequent intermediate stage during manufacturing and corresponding to a pressure sensor.

An optional sealing layer 26 may be provided to hermetically seal the trenches 24 and the space 28 from which the sacrificial layer 18 was removed. The sealing layer 26 may be formed of, e.g., a low temperature oxide (LTO). FIG. 16 is a schematic cross-sectional view of the substrate 10, layer 20, trenches 24, space 28 and sealing layer 26. By providing a reference vacuum enclosed in the structure illustrated in FIG. 17, such structure may correspond to a pressure sensor. The pressure sensor illustrated in FIG. 17 may provide for very precise measurement of pressure due to the precise geometry of the trenches 24, the space 28 and the structure between the trenches 24.

Figure 7A:
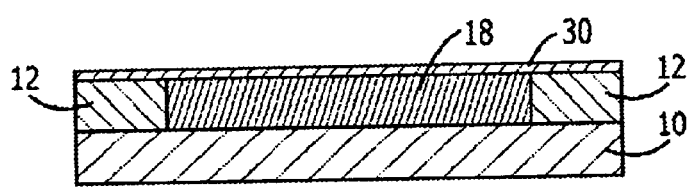
FIGS. 7A to 7C are schematic cross-sectional views of the semiconductor device in subsequent, optional intermediate stages during manufacturing.
Figure 7B:
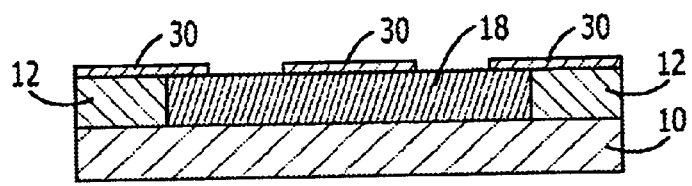
Figure 7C:
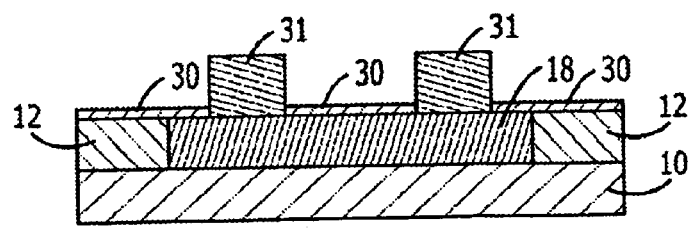

An optional isolation layer 30 may be provided on the masking layer 12 and the sacrificial layer 18 as illustrated in FIG. 7A. The isolation layer 30 may be formed of an oxide material, e.g., silicon dioxide ($SiO_2$). The isolation layer 30 may be structured in accordance with the photolithographic techniques described above to expose portions of the sacrificial layer 18 through the isolation layer 30 in accordance with a predetermined pattern of a mask used in the photolithography process. FIG. 7B is a schematic cross-sectional view of the substrate 10, the masking layer 12, the sacrificial layer 18 and the isolation layer 30 after structuring or patterning the isolation layer 30. As illustrated in FIG. 7B, portions of the sacrificial layer 18 are exposed through the isolation layer 30 in accordance with the predetermined pattern of the mask used in the structuring or patterning of the isolation layer 30. Then, a layer, e.g., monocrystalline silicon layer, may be grown in an epitaxial reactor on the exposed portions of sacrificial layer 18, which may have a monocrystalline structure, the remaining portions of the isolation layer 30 being free from the monocrystalline silicon so grown. Thus, the exposed portions of the sacrificial layer 18 may act as a mold for monocrystalline silicon to be grown. FIG. 7C is a schematic cross-sectional view of the substrate 10, the masking layer 12, the sacrificial layer 18, the isolation layer 30 and the layer 31 grown on the sacrificial layer 31.

Figure 10A:
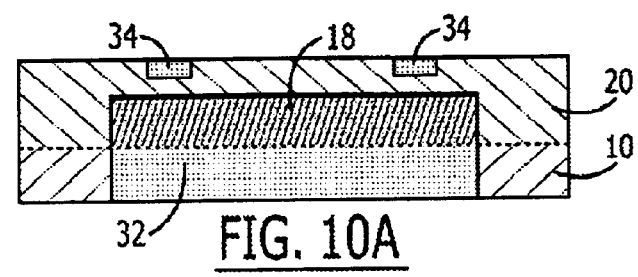
FIG. 10A is a schematic cross-sectional view of the semiconductor device in a subsequent, optional intermediate stage during manufacturing.

As a further alternative, the substrate 10 may be etched as schematically illustrated in FIG. 10A. As schematically illustrated in FIG. 10A, the substrate 10 is etched in a region corresponding to the sacrificial layer 18. The sacrificial layer 18 having been removed, as indicated above, is illustrated in FIG. 10A in phantom. A cavity or trench 32 is thus formed. Piezoresistors 34 are formed in the layer 20 opposite to the trench 32. Thus, a differential pressure sensor 36 may be formed in accordance with the present invention.

Referring again to FIG. 5, it is possible to etch slightly into the substrate 10 during or after the removal of the exposed portions of the masking layer 12 and before the deposition or application or the sacrificial layer 18. This etching of the substrate 10 may be performed, e.g., using trench etching techniques. Accordingly, the sacrificial layer 18 applied or deposited on the substrate 10 is applied or deposited into a trench or pocket formed in the substrate 10. This arrangement may prevent the sacrificial layer 18, which may have a relatively low melting temperature, from flowing out of the desired region, i.e., the trench or pocket formed in the substrate 10, during further processing.

FIG. 17 is a schematic cross-sectional view of an integrated circuit 50, which includes an acceleration sensor 51. The integrated circuit 50 further includes integrated circuitry 52, which may be configured to perform operations and calculations. The integrated circuit 50 may include circuits made of, e.g., Al and/or copper. The integrated circuitry 52 may be configured to evaluate signals generated by the acceleration sensor 51, which may be produced according to method(s) described above. Similar to the arrangement illustrated in FIG. 15, the acceleration sensor 51 illustrated in FIG. 17 includes trenches 60, 61, 62, 63, a hollow space 64 and self-supporting structures 65, 66 and 67 above hollow space 64.

FIG. 18 is a schematic cross-sectional view of an integrated circuit 70, which includes a pressure sensor 71. The integrated circuit 70 further includes integrated circuitry 72, which may include, for example, Al and/or copper structures configured to perform operations and calculations. The integrated circuitry 72 may be configured to evaluate signals generated by the pressure sensor 71. The pressure sensor 71 may be produced according to the method(s) described above. Similar to the pressure sensor illustrated in FIG. 16, the pressure sensor 71 illustrated in FIG. 18 includes trenches 80, 81, 82, 83, a hollow space 84, self-supporting structures 85, 86 and 87 above hollow space 84 and a third layer 88.

Figure 19:
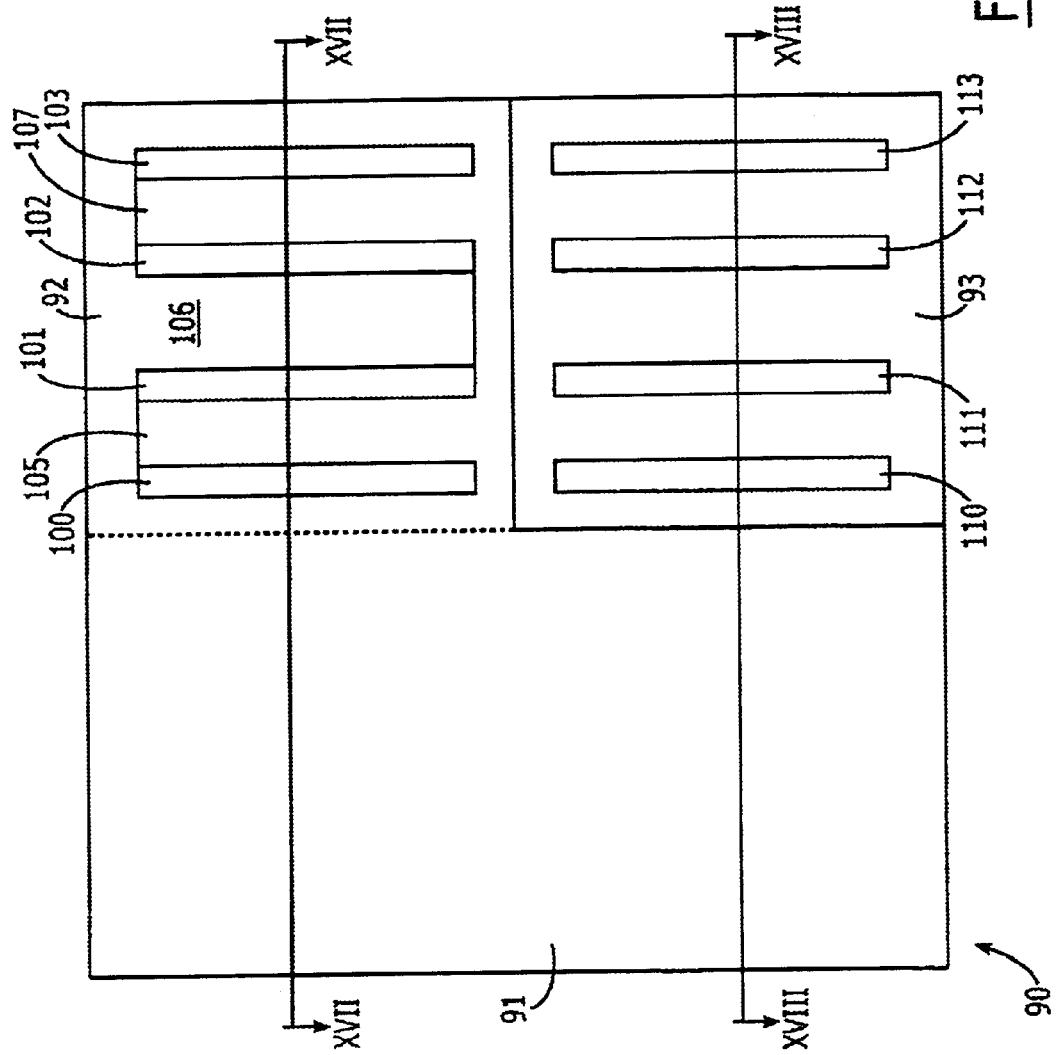
FIG. 19 is a schematic top view of an integrated circuit manufactured in accordance with the method of the present invention.

FIG. 19 is a schematic top view of an integrated circuit 90, which includes a section 91 having integrated circuitry, an acceleration sensor 92 and a pressure sensor 93. The integrated circuitry may be configured to evaluate signals generated by the pressure sensor 93 and/or the acceleration sensor 92. The acceleration sensor 92 may be produced according to the method(s) described above and may include trenches 100, 101, 102, 103, a hollow space and self-supporting structure 105, 106 and 107 above the hollow space. Reference numerals 110, 111, 112 and 113 designate areas where a third layer corresponding to the layer 26 illustrated in FIG. 16 and the third layer 88 illustrated in FIG. 18 cover trenches 24 and 80, 81, 82 and 83, respectively.

The schematic cross-sectional view of the integrated circuit illustrated in FIG. 17 may correspond to the integrated circuit 90 illustrated in FIG. 19, the cross-sectional view illustrated in FIG. 17 taken along the line XVII—XVII illustrated in FIG. 19. In this case, the reference numerals 92, 100, 101, 102, 103, 105, 106 and 107 may correspond to reference numerals 51, 60, 61, 62, 63, 65, 66 and 67, respectively.

The schematic cross-sectional view of the integrated circuit illustrated in FIG. 18 may correspond to the integrated circuit 90 illustrated in FIG. 18, the cross-sectional view illustrated in FIG. 19 taken along the line XVIII—XVIII illustrated in FIG. 19. In this case, the areas 110, 111, 112 and 113 illustrated in FIG. 19 may correspond to the areas of the third layer 88 above the trenches 80, 81, 82 and 83 illustrated in FIG. 18.

The etching of the trench 24 illustrated in FIG. 13 may be performed to produce a sensor configured for use in the capacitive measurement principle. In this regard, an oxide layer may be deposited on the layer 20 and, in accordance with the photolithography techniques described above, a trench area of the oxide layer may be exposed. Then, the exposed trench area of the oxide layer may be etched, and a portion of the layer 20 corresponding to the trench area may be etched to form a corresponding partial trench in the layer 20. Further trenching of the oxide layer and/or layer 20 may be subsequently performed. Thereafter, a doping of the layer 20 may be performed with, for example, an n-dopant, e.g., phosphor, or a p-dopant, e.g., boron. After the doping, the partial trench in layer 20 may be deepened, and further structuring or patterning by the photolithography techniques described above may be performed.

Figure 20:
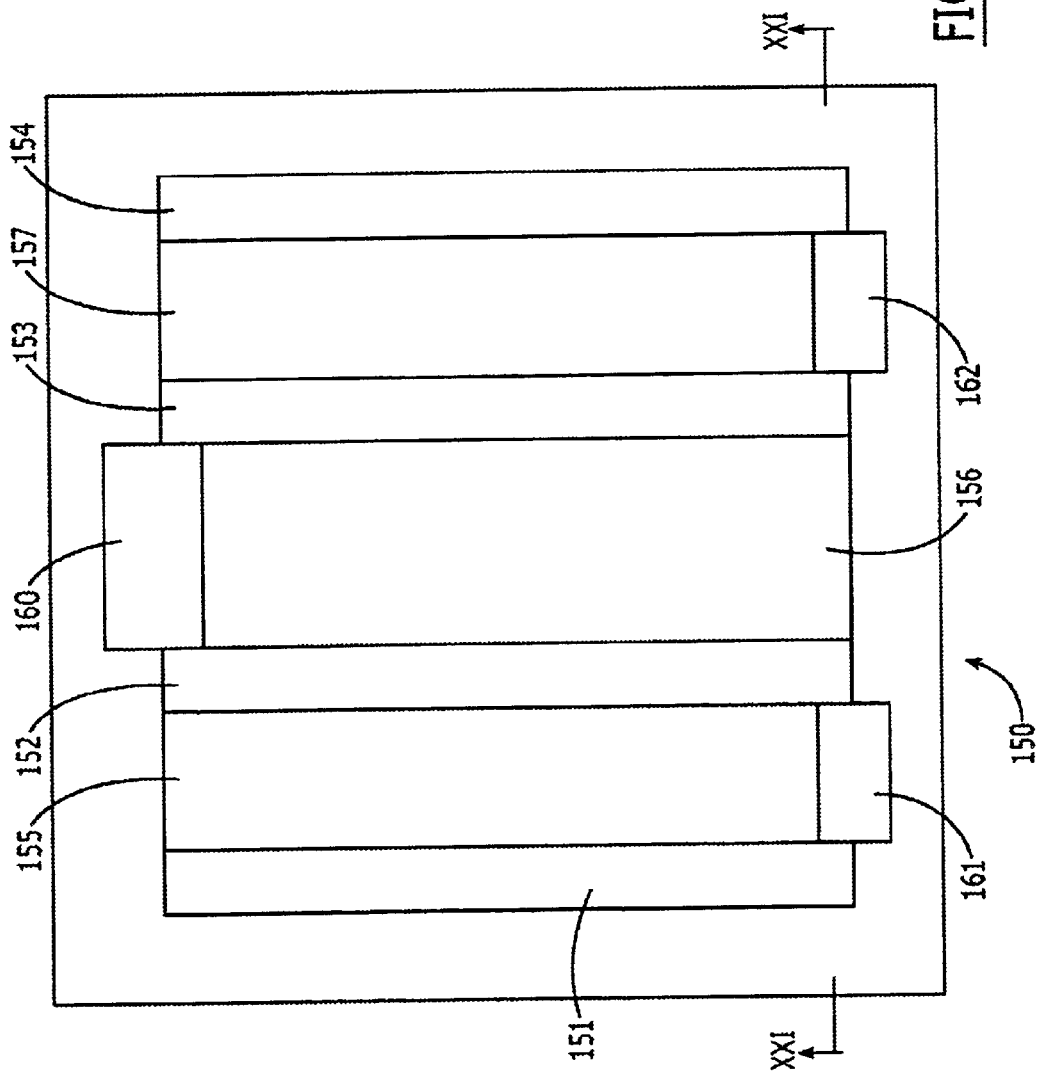
FIG. 20 is a schematic top view of a piezoresistive or piezoelectric acceleration sensor manufactured in accordance with the method of the present invention.
Figure 21:
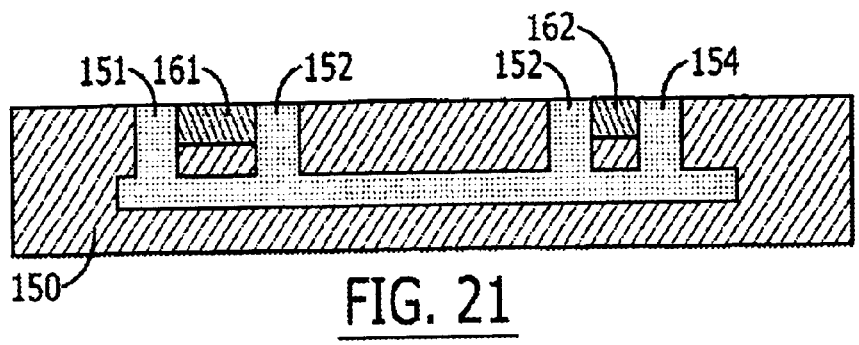
FIG. 21 is a schematic cross-sectional view of the piezoresistive or piezoelectric acceleration sensor illustrated in FIG. 20.

FIG. 20 is a schematic top view of an example embodiment of a piezoresistive or piezoelectric acceleration sensor 150. Reference numerals 151, 152, 153 and 154 illustrated in FIG. 20 designate trenches, which correspond to trenches 24 illustrated in FIG. 15. Reference numerals 155, 156 and 157 designate self-supporting structures, which correspond to self-supporting structures arranged between the trenches 24 illustrated in FIG. 15. The piezoresistive or piezoelectric acceleration sensor 150 includes piezo-elements 160, 161 and 162, which may include piezoelectric elements. The piezoresistive or piezoelectric acceleration sensor 150 may be provided as an alternative to acceleration sensors 51 and 92. FIG. 21 is a schematic cross-sectional view of the piezoresistive or piezoelectric acceleration sensor 150 illustrated in FIG. 20 taken along the line XXI—XXI.

Figure 22:
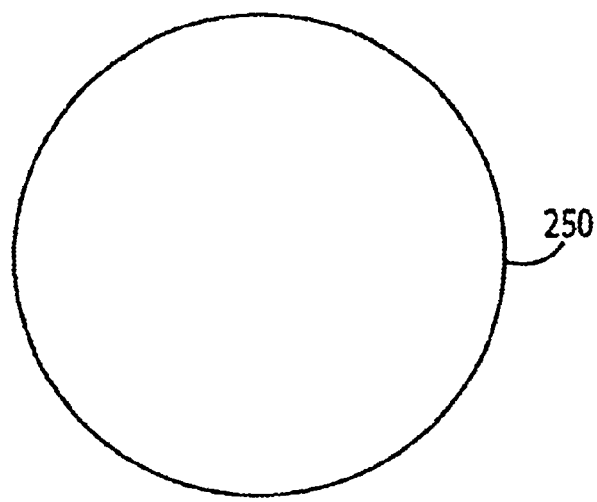
FIG. 22 is a schematic top view of a wafer according to the present invention.
Figure 23:
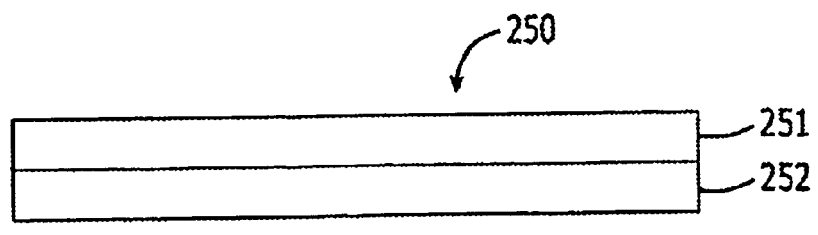
FIG. 23 is a schematic side view of the wafer illustrated in FIG. 22.

FIG. 22 is a schematic top view of a wafer 250 according to the present invention. The wafer 250 has a circular shape. FIG. 23 is a schematic side view of the wafer 250 illustrated in FIG. 22. The wafer 250 includes a sacrificial layer 251, which is deposited on a substrate 252. In an example embodiment of the substrate 252, the substrate 252 may include monocrystalline silicon.

While the above example embodiments are described using a p-varnish, it is also possible to use an n-varnish instead of the p-varnish or a combination of an n-varnish and a p-varnish as masking layers.

Furthermore, the foregoing method(s) may also be suitable for generating defined and especially residual-free surface-conductive layers. After the epitaxial deposition of the layer 20, a hard mask may be used as an alternative to a photoresist mask. In this case, the hard mask may not be penetrated by a later deposition of doping. Then, the trenching of the desired structure defined by the hard mask, which itself may be structured by the photolithography techniques described above, may not be performed all the way through the layer 20 to the sacrificial layer 18. Rather, the trenching may be stopped when there is still a portion of the material of the layer 20 on the bottom of the trenches. Then, a doping is performed, which makes all exposed Si surfaces conductive, including the side walls of the trenches. Then, the trenching may be resumed and completed by trenching into the sacrificial layer 18. Thus, the trenching may clean the bottom of the trenches before the etching of the sacrificial layer 18 is performed, and the side walls may remain conductive because trenching may be highly anisotropical. Accordingly, the sacrificial layer is free of the doping, which would float around in the etching of the sacrificial layer since the etching of the sacrificial layer 18 may etch only the sacrificial 18 not the dopants.

While the present invention has been described in connection with the foregoing example embodiments, it should be readily apparent to those of ordinary skill in the art that the example embodiments are exemplary in nature and are not to be construed as limiting the scope of protection for the invention as set forth in the appended claims.

What is claimed is:

1. A method for manufacturing a semiconductor device, comprising the steps of:

providing a substrate;

depositing a monocrystalline sacrificial layer onto the substrate;

depositing a monocrystalline function layer onto the sacrificial layer; and removing at least part of the sacrificial layer after the function layer depositing step.

2. The method according to claim 1, wherein the substrate includes silicon.

3. The method according to claim 1, wherein the sacrificial layer includes $Si_xGe_y$.

4. The method according to claim 1, further comprising the steps of:

depositing a masking layer on the substrate before the sacrificial layer depositing step; and selectively removing a portion of the masking layer to expose the substrate in a first predetermined pattern before the sacrificial layer depositing step;

wherein the sacrificial layer is deposited in the sacrificial layer depositing step on the substrate in accordance with the first predetermined pattern.

5. The method according to claim 4, wherein the portion of the masking layer is removed in the masking layer selective removing step by photolithography.

6. The method according to claim 4, wherein the masking layer selective removing step includes the substeps of:

applying a photoresist to the masking layer;

exposing the photoresist in accordance with the first predetermined pattern;

developing the exposed photoresist to expose the masking layer in accordance with the first predetermined pattern; and removing the exposed masking layer.

7. The method according to claim 6, wherein the masking layer selective removing step includes the substep of removing the photoresist from the masking layer after the masking layer removing step.

8. The method according to claim 1, further comprising the step of planarizing the function layer after the function layer depositing step.

9. The method according to claim 4, further comprising the step of removing a remaining portion of the masking layer after the sacrificial layer depositing step.

10. The method according to claim 9, wherein the function layer is deposited in the function layer depositing step after the remaining portion of the masking layer removing step.

11. The method according to claim 10, further comprising the step of selectively removing a portion of the function layer in accordance with a second predetermined pattern.

12. The method according to claim 11, wherein the function layer is selectively removed in the function layer selective removing step by photolithography.

13. The method according to claim 11, wherein the function layer selective removing step includes the substeps of:

applying a photoresist to the function layer;

exposing the photoresist in accordance with the second predetermined pattern;

developing the exposed photoresist to expose the function layer in accordance with the second predetermined pattern; and removing the exposed function layer.

14. The method according to claim 13, further comprising the step of removing the photoresist from a remaining portion of the function layer.

15. The method according to claim 13, wherein the exposed function layer removing step includes trench etching.

16. The method according to claim 13, wherein the exposed function layer is removed in the exposed function layer removing step at least to a depth to the sacrificial layer.

17. A method for manufacturing a semiconductor device, comprising the steps of:

providing a substrate;

depositing a monocrystalline sacrificial layer onto the substrate;

depositing a monocrystalline function layer onto the sacrificial layer;

removing at least part of the sacrificial layer after the function layer depositing step;

applying a photoresist to the function layer;

exposing the photoresist in accordance with the second predetermined pattern;

developing the exposed photoresist to expose the function layer in accordance with the second predetermined pattern;

removing the exposed function layer; and removing substantially all of the sacrificial layer after the exposed function layer removing step.

18. The method according to claim 11, further comprising the step of depositing a sealing layer on the function layer after the function layer selective removing step.

19. The method according to claim 1, wherein the semiconductor device includes at least one of an acceleration sensor and a pressure sensor.

20. The method according to claim 4, further comprising the step of applying an isolation layer on the sacrificial layer and the masking layer.

21. The method according to claim 20, further comprising the step of selective removing a portion of the isolation layer.

22. The method according to claim 21, wherein the isolation layer is selectively removed in the isolation layer selective removing step by photolithography.

23. The method according to claim 21, wherein the isolation layer selective removing step includes the substeps of:

applying a photoresist to the isolation layer;

exposing the photoresist in accordance with a third predetermined pattern;

developing the exposed photoresist to expose the isolation layer in accordance with the third predetermined pattern; and removing the exposed isolation layer.

24. The method according to claim 23, wherein the sacrificial layer is exposed through the isolation layer in accordance with the third predetermined pattern, the method further comprising the step of epitaxially growing a second monocrystalline layer on the exposed sacrificial layer in accordance with the third predetermined pattern.

25. The method according to claim 1, further comprising:

performing a back-end etching of the sacrificial layer with an etchant that is not harmful to a metallization of an integrated circuit on the substrate.

26. The method according to claim 25, wherein the etchant includes $H_2O_2$.

* * * * *